(12) United States Patent
Levanon et al.

(10) Patent No.: US 6,541,181 B1
(45) Date of Patent: *Apr. 1, 2003

(54) POSITIVE ACTING PHOTORESIST COMPOSITION AND IMAGEABLE ELEMENT

(75) Inventors: Moshe Levanon, Ness-Ziona (IL); Emmanuel Lurie, Lod (IL); Sergei Malikov, Rehovot (IL); Oleg Naigertsik, Kazerin (IL); Larisa Postel, Kiryat Malachi (IL)

(73) Assignee: Creo IL. Ltd., Herzlia Pituah (IL)

( * ) Notice: Subject to any disclaimer, the term of this patent is extended or adjusted under 35 U.S.C. 154(b) by 0 days.

This patent is subject to a terminal disclaimer.

(21) Appl. No.: 09/625,582

(22) Filed: Jul. 26, 2000

Related U.S. Application Data

(63) Continuation-in-part of application No. 09/365,279, filed on Jul. 30, 1999, now Pat. No. 6,255,033.

(51) Int. Cl.[7] .............................. G03C 1/77; G03C 1/73; G03F 7/039; G03F 7/09
(52) U.S. Cl. ............................ 430/275.1; 430/277.1; 430/278.1; 430/270.1; 430/905; 430/909; 430/944; 430/326
(58) Field of Search ............... 430/275.1, 277.1, 430/278.1, 270.1, 909, 905, 944, 326; 525/56, 60, 61; 522/153, 154

(56) References Cited

U.S. PATENT DOCUMENTS

| | | |
|---|---|---|
| 4,374,193 A | 2/1983 | Moriya et al. ............... 430/149 |
| 4,665,124 A | 5/1987 | Walls et al. ................... 525/61 |
| 4,708,925 A | 11/1987 | Newman ................. 430/270.1 |
| 4,724,465 A | 2/1988 | Davies ......................... 355/53 |
| 4,940,646 A | 7/1990 | Pawlowski .................. 430/175 |
| 5,169,897 A | 12/1992 | Walls ........................... 525/61 |
| 5,169,898 A | 12/1992 | Walls et al. ................... 525/61 |
| 5,339,737 A | 8/1994 | Lewis et al. ................ 101/454 |
| 5,372,907 A | 12/1994 | Haley et al. ................ 430/157 |
| 5,401,611 A | 3/1995 | Edwards, Sr. et al. ....... 430/276 |
| 5,491,046 A | 2/1996 | DeBoer et al. ............. 430/302 |
| 5,493,971 A | 2/1996 | Lewis et al. ................ 101/454 |
| 5,512,418 A | 4/1996 | Ma .......................... 430/271.1 |
| 5,641,608 A | 6/1997 | Grunwald et al. .......... 430/302 |
| 5,700,619 A | 12/1997 | Baumann et al. ........... 430/175 |
| 5,713,287 A | 2/1998 | Gelbart ....................... 101/467 |
| 5,792,823 A | 8/1998 | Kim et al. ................... 526/266 |
| 5,853,958 A | 12/1998 | Cheng et al. ............. 430/286.1 |
| 5,994,031 A | 11/1999 | Hirai et al. ................. 430/302 |
| 6,255,033 B1 * | 7/2001 | Levanon et al. ......... 430/275.1 |

FOREIGN PATENT DOCUMENTS

| | | |
|---|---|---|
| EP | 0848290 | 6/1998 |
| GB | 1245924 | 9/1967 |
| JP | 9328519 | 12/1997 |
| WO | 9739894 | 10/1997 |
| WO | 9842507 | 10/1998 |
| WO | 9901795 | 1/1999 |
| WO | 9908157 | 2/1999 |
| WO | 9908879 | 2/1999 |
| WO | 9911458 | 3/1999 |
| WO | 9921725 | 5/1999 |

* cited by examiner

Primary Examiner—Janet Baxter
Assistant Examiner—Sin J. Lee
(74) Attorney, Agent, or Firm—G.E. Ehrlich Ltd.

(57) ABSTRACT

A positive acting, composition that can be heat-sensitive is presented, either coated on a lithographic base, or on a printing circuit board base, and comprises a water soluble heat-sensitive resin, a novel adhesion promoter and a radiation absorbing agent—a dye or a pigment. An excellent film forming polymer that comprises acetal units directly pendant from the polymer polyvinyl alcohol backbone may be the only binder resin, when other resins being optional. The solubility of the coated material in the areas exposed to near -IR laser radiation in mild alkaline developers becomes considerably higher, allowing to obtain high resolved patterns of the etch-resistant material on printing circuit boards or lithographic printing plates. The composition can be applied on the substrate from a liquid of laminated as a dry film. Sensitizers may be added to render the composition sensitive to radiation in a non-thermal sense.

19 Claims, No Drawings

POSITIVE ACTING PHOTORESIST COMPOSITION AND IMAGEABLE ELEMENT

RELATED INVENTIONS

This Application is a continuation-in-part of U.S. Ser. No. 09/365,279 filed Jul. 30, 1999, Titled POSITIVE ACTING PHOTORESIST COMPOSITION AND IMAGEABLE ELEMENT, now U.S. Pat. No. 6,255,033, issued Jul. 3, 2001.

BACKGROUND OF THE INVENTION

1. Field of the Invention

The present invention relates to the field of imaging, particularly resist imaging, more particularly to thermal resist imaging, and still more particularly laser direct imaging. The invention describes novel positive-acting thermal resist compositions, thermal resist structures, thermal resist processes, and thermal resist systems, as well as novel synthetic procedures for the formation of the resist materials.

2. Background of the Art

The merits of Laser Direct Imaging (LDI) have been recognized for a long time in the printing industry for production of offset printing plates, and also in printed circuit board (PCB) production. LDI offers the potential benefits of better line quality, just in-time processing, improved manufacturing yields, elimination of film costs, and other recognized advantages. In direct imaging methods, the exposure of only the selected areas of the heat-sensitive coating by a suitably focused source of energy effects required changes in the coating composition. See, e.g. U.S. Pat. No. 4,724,465, U.S. Pat. No. 5,641,608 (McDermid), U.S. Pat. No. 5,713,287 (Gelbart), the teachings of which are incorporated herein by reference.

Thermally-sensitive imaging elements are classified as compositions that undergo chemical transformation(s) in response to exposure to, and absorption of, suitable amounts of heat energy. The nature of thermally-induced chemical transformation may be to ablate the composition, or to change the solubility of the composition in a particular developer, or to change tackiness of the surface, or to change the hydrophilicity or the hydrophobicity of the surface of the thermally-sensitive layer. As such, selective heat exposure of predetermined areas (image-wise distribution of heat energy) of a film or layer formed of a thermally sensitive composition has the capability of directly or indirectly producing a suitably imaged pattern of composition which can serve as a resist pattern in PCB fabrication, or in production of lithographic printing plates.

In a manner similar to that with photoresists, heat-sensitive compositions can be positive-working or negative-working. With a positive-working heat-sensitive composition, the selective exposure of the film to an appropriately focused beam that can generate the requisite thermal energy will either (a) ablate the so-exposed composition, in which case the desired graphic pattern is directly produced, and the pattern is represented by the remaining film portions not exposed to the focused heat energy and thus not ablated, or (b) cause the so-exposed composition to become differentially more soluble in a suitable solvent, in which case what is essentially a latent image is produced in the film. This latent image enables the film to be dissolved in the heat-exposed areas and remain insoluble and left behind in the non-heat-exposed areas, providing the desired pattern. With a negative-acting heat-sensitive composition, selective exposure of the film to the appropriately focused beam of the requisite thermal energy causes the so-exposed areas to become differentially less soluble in a suitable developer, such that contact with the developer dissolves away the areas that are not heat-exposed and leaves behind the heat-exposed areas as the desired pattern.

Through use of the heat-sensitive imaging elements, the ability to produce a pattern on a substrate surface by direct imaging without use of a phototool is greatly enhanced because the imaging beam need only be a suitably focused source of required thermal energy, such as can be formed from low-cost solid state lasers, as opposed to the focused source of narrow-band radiation of a particular wavelength required for direct imaging of photoresists. Focused thermal energy sources, such as an infrared laser beam, are inherently better suited for use in commercial-scale operations in terms of expense, life and reliability than the UV beams needed for direct imaging of many photo-sensitive compositions. Moreover, the heat-sensitive compositions, which need undergo only thermally-induced composition change rather than a photo-induced change in components or compositions, should be inherently less complicated than photo-sensitive compositions in direct imaging processes. As such, not only can thermally-sensitive compositions be formulated in the cost-effective manner needed for industrial uses such as PCB fabrication, but their simpler mechanism of operation enables operation in room light or day light and tends to provide or enable generally better shelf stability.

Positive working photosensitive compositions based on novolak-diazoquinone resins are the main imaging material of the computer chip industry (see, e.g. R. R. Dammel, Diazonaphthoquinone-based Resists, Tutorial text No. 11, SPIE Press, Bellingham. Wash., 1993).

This rearrangement is not only very fast, but also highly exothermic (delta H is at least 66 kcal/mol). The sudden appearance at the location of the solubility inhibitor of a heat pulse of that magnitude causes a temperature spike of not less than about 220° C.

This model may explain the fact that a wide range of heat sensitive compositions based on novolak resins where different types of inhibitors were incorporated have appeared in patent literature and in commercial announcements. For example, positive working direct laser addressable printing form precursors based on phenolic resins sensitive to UV, visible and/or infra-red radiation were described. (see, e.g. U.S. Pat. No. 4,708,925 (Newman, 3M); U.S. Pat. No. 5,372,907 (Haley et. al., Kodak); U.S. Pat. No. 5,491,046 (DeBoer et. al., Kodak)). In U.S. Pat. No. 4,708,925, the phenolic resin dissolution in alkaline solution was decreased by a radiation sensitive onium salt instead of DNQ, with the native solubility of the resin being restored upon photolytic decomposition of the onium salt. The onium salt composition is intrinsically sensitive to UV radiation and can be additionally sensitized to infra-red radiation. U.S. Pat. Nos. 5,372,907 and 5,491,064 utilize direct positive working systems based on a radiation induced decomposition of a latent Bronsted acid to increase the solubility of the resin matrix on imagewise exposure. All three described compositions can be additionally utilized as a negative working system with additional processing after imaging and predevelopment.

WO 97/39894 (Horsell) describes a heat sensitive composition and a process for making lithographic printing plates by laser direct imaging (LDI). The composition is based on a complex of a phenolic resin and a range of inhibitors containing strong hydrogen acceptors, examples of which are nitrogen containing heterocycles and compounds comprise at least one nitrogen atom which is quaternised. Also, a series of carbonyl containing compounds widely known as inhibitors in UV sensitive compositions of phenolic resins were found to be inhibitors for the heat-sensitive composition. This is not surprising in view of the above-mentioned model (A. Reiser). The composition described in WO 97/39894 (Horsell) is believed not be sensitive to UV and visible light, contrary to the above-mentioned compositions based on onium salts or Bronsted acid decomposition.

WO 97/39894 describes radiation absorbing compounds capable of absorbing incident radiation and converting it to heat. The Horsell reference used, for example, dyes selected from following classes, squarilium, cyanine, merocyanine, pyrylium and other classes known to those skilled in the art. Organic and inorganic pigments such as carbon black or phthalocyanine pigments may also be useful as radiation absorbing materials converting the absorbed incident light to heat.

WO 99/08879 (Horsell) describes radiation sensitive compositions for coatings in the production of printed circuits and their electronic parts and for mask production. These coatings are based on phenolic resins with poor mechanical properties typical of that class of resins.

WO 99/01795 (Horsell) describes a method for producing a predetermined resist pattern, for example on a printing plate, circuit board or mask. The method is characterized by the use of a novel polymeric material functionalized by groups to render it insoluble in a developer, but with properties such that exposure to radiation renders it soluble in the developer. The groups are not diazide groups as in conventional systems, but are groups that do not release nitrogen on exposure to radiation and have hydrogen bonding capability. Examples of such groups are 2-naphthylsulfonyloxy, 2-thienylsulfonyloxy, dansyloxy, p-toluenesulfonyloxy, benzyloxy and n-butylsulfonyloxy.

WO 99/21725 (Horsell) describes compositions based on novolak resins in the production of lithographic printing plates. The solubility of the compositions in aqueous developers is increased in heated areas. The composition contains a compound that increases the resistance in non-heated areas of the heat-sensitive composition to development (dissolution) in aqueous developer. The composition comprising compounds inclusive of A) poly(alkylene oxide) units; B) silicone units; and C) esters, ethers and amides of polyhydric alcohols.

WO 98/42507 (Kodak Polychrome Graphics) discloses a positive-working heat-sensitive composition that is imageable using an Infrared (IR) radiation laser without the necessity of a post-exposure baking step and without any flooding exposure step. This composition comprises a phenolic resin, an infrared radiation absorbing compound, and a dissolution inhibitor that is non-photosensitive, and which is capable of providing sites for hydrogen bonding with the phenolic moieties of the binder resin.

WO 99/08157 (Kodak Polychrome Graphics) provides an infrared imaging composition that contains two essential ingredients: a non-basic infrared radiation-absorbing material (such as carbon black) and a phenolic resin that is either mixed or reacted with a diazonaphthoquinone derivative. These compositions are useful in a positive-working or negative-working imaging mode, as in lithographic printing plates.

WO 99/11458 (Kodak Polychrome Graphics) also describes a phenolic-based resin (or other polymers having pendent hydroxy, carboxylic acid, amide, nitric acid or combinations thereof) and an infrared absorbing compound. The imaging layer may also contain a second polymer that has bonded, pendent groups that are 1,2-naphthoquinone diazide, hydroxy, carboxylic acid, sulfonamide, nitrile, etc. The imaging layer may also contain a solubility inhibiting agent, a visible dye, or both.

A wide range of thermally-induced compositions useful as thermographic recording materials have been disclosed in GB 1,245,924 (Agfa), such that the solubility of any given area of the imagable layer in a given solvent can be increased by the heating of the layer by indirect exposure to a short duration high intensity visible light and/or infrared radiation transmitted or reflected from the background areas of a graphic original located in contact with the recording material. The systems described are varied and operate by many different mechanisms and use different developing materials ranging from water to chlorinated organic solvents. Included in the range of compositions disclosed which are aqueous developable are those which comprise a novolak resin. The patent describes that coated films of such resins show increased solubility on heating. The compositions may contain heat absorbing compounds such as carbon black or Milori Blue (C.I. Pigment Blue 27), these materials additionally color the images for their use as a recording medium.

To our knowledge, there are few positive-working heat-sensitive compositions directly related to fabrication of printing circuit boards using LDI which are described in the patent literature. Some compositions of this type are described in U.S. Pat. No. 5,641,608 (McDermid), but the coating composition on the copper surface of the printing circuit board was scanned previously using a UV laser and only afterward by the infrared laser. Another example of a positive-acting thermo-resist described in this patent does not contain any radiation absorbing material able to convert the infrared light to heat, and it is not clear how the transparent to IR light composition changes its chemistry (acidic hydrolysis of the protecting t-butyloxy carbonyl group) to provide differentiation in the developer solution. The same is not clear regarding the negative-working compositions exposed to infrared beam, where the negative-working compositions do not contain radiation-absorbing material in the coated on copper transparent to IR film.

The advantages of positive-working photoresist applied as a monolayer dry film, versus negative-acting dry resists, in production of printing circuit boards are described in EP 0848290 (Morton) and in T. A. Koes and S. H. Wheeler, IPC Expo 98 Proceedings, S12-3-1.

Examples of heat-sensitive negative-working resist compositions are presented in U.S. Pat. 5,512,418 (Ma, Du Pont), the energy needed for polymerization of the imaged areas is in the range of 600 mJ/cm$^2$, and the time that will be needed for imaging should be very long, and not answering the requirements for high throughputs in the PCB industry.

Polyvinyl acetals polymers, especially polyvinyl butyrals are used in a very wide range of products as binders, due to their excellent film forming and outstanding mechanical characteristics, these polymers are also known as materials with very good resistance to chemical attack. One of the applications of these polymers is in radiation-sensitive compositions, where they serve as binders for negative-working printing plate fabrication, and production of photoresists for the printed circuit board field. The polyvinyl butyrals or polyvinyl formals belong to materials that are not soluble in aqueous developers used in the preparation of printing plates or printing circuit boards. Many different polymers have been proposed for use as binders in negative-working UV-sensitive compositions that provide the required aqueous solubility.

Particular advantages have been achieved for polymers containing hydroxyl or carboxyl groups in the acetal moieties.

These binder polymers are described in U.S. Pat. Nos. 4,665,124; 4,940,646; 5,169,898; 5,169,897; 5,700,619. A photosensitive material containing a resin binder, including a vinylic polymer having phenolic hydroxyl groups and aromatic diazonium salt having only a single diazo group was disclosed in U.S. Pat. No. 4,374,193. Polymers containing p-hydroxybenzal moieties are also described in U.S. Pat. No. 5,792,823 as precursors for polymers used as chemically amplified positive-working resists in microlithography, but the hydroxybenzaldehyde acetal polymers are not themselves used as the composition in the positive-acting resist layer. JP 09,328,519 teaches that similar polyvinyl acetals used as oxygen inhibitors.

SUMMARY OF THE INVENTION

The present invention provides novel positive-acting, thermally imagable compositions and elements. The positive-acting thermally activatable compositions comprise a heat absorbing component, an adhesion promoter and a particular class of heat-sensitive acetal polymer as a resin binder component. Preferred imaging elements of the invention are heat-sensitive compositions based on these polymers that undergo a thermally-induced change in their solubility, in mildly alkaline solutions when irradiated with near-infrared wavelength applied by a laser imaging device.

Therefore, according to a first embodiment, this invention comprises acetal polymers bearing the following recurring units within the polymer backbone:

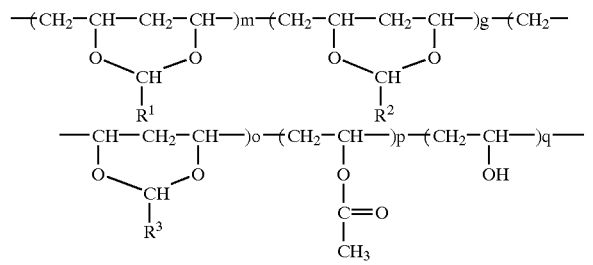

wherein $R_1$ is —$C_nH_{2n+1}$ where n=1–12;

$R_2$ is a phenol group which may have no substituents or 1 (to a preferable maximum of 3) additional substituent selected from the group consisting of —OH, —OCH$_3$, —Br and —NO$_2$ or —COOH; which may be represented, at least in part, by the formula:

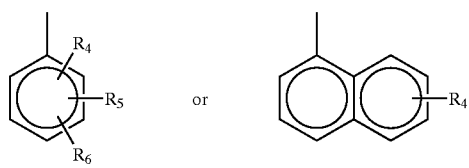

wherein $R_4$=—OH; $R_5$=—OH or —OCH$_3$ or —Br or —O—CH$_2$—C≡CH; and $R_6$=—Br or —NO$_2$;

$R_3$=—(CH$_2$)$_a$—COOH, —C≡CH, or

where $R_7$=COOH, —(CH$_2$)$_a$—COOH, —O—(CH$_2$)$_a$—COOH, and a=0 or 1, and m=5–40 mole %, preferably 15 to 35 mole % g=10–60 mole %, preferably 20 to 40 mole % o=0–20 mole %, preferably 0 to 10 mole % p=2–20 mole %, preferably 1 to 10 mole % q=5–50 mole %, preferably 15 to 40 mole %

As indicated by the above structural formula, the acetal polymers of this invention can be tetramers, in which the recurring unit comprises a vinyl acetate moiety and a vinyl alcohol moiety and first and second cyclic acetal groups, or pentamers in which the recurring unit comprises a vinyl alcohol moiety, a vinyl acetate moiety and first, second and third cyclic acetal group. All three of the acetal groups are six-member cyclic acetal groups, one of them is substituted with an alkyl group, another with an aromatic group substituted with a hydroxy-, or a hydroxy- and alkoxy-, or hydroxy- and nitro- and Br— groups; and a third is substituted with an acid group, an acid substituted alkyl group or an acid substituted aryl group. A particularly potential advantage on copper surfaces is provided where $R_5$=—C≡CH. That particular group, as explained in greater detail herein, provided good adhesion to copper surfaces. The provision of the group within the polymer itself further reduces the need for compounding of the composition of the invention.

DETAILED DESCRIPTION OF THE INVENTION

One important component of the practice to the present invention is the selection of the thermally-sensitive polymer component for the positive-acting resist layer. The acetal polymer, as generally described above, should comprise from at least about 5 to at most about 60% mole percent of phenolic groups (or number percent of units within the polymer chain):

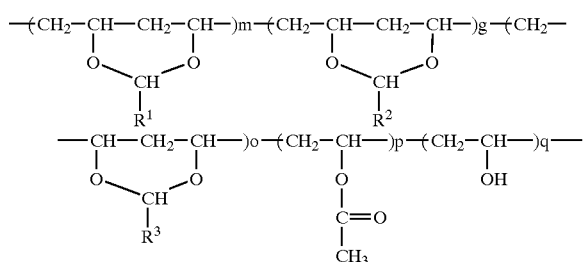

wherein:

$R_1$ is —$C_nH_{2n+1}$ where n=1–12;

$R_2$ is a phenol group which may have no substituents or 1 (to a preferable maximum of 3) additional substituent selected from the group consisting of —OH, —OCH$_3$, —Br and —NO₂ or —COOH; which may be represented, at least in part, by the formula:

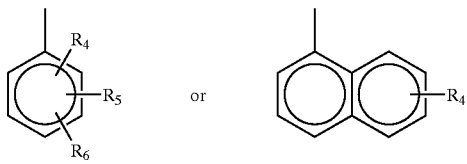

wherein R₄=—OH ; R₅=—OH or —OCH₃ or —Br or —O—CH₂—C≡CH; and R₆=—Br or —NO₂; R₃=—(CH₂)ₐ—COOH, —C≡CH, or

where
R₇=COOH, —(CH₂)ₐ COOH or —O—(CH₂)ₐ COOH, and a=0 or 1,
and
m=about 5–40 mole %, preferably 15 to 35 mole %
g=about 5–60 or about 10–60 mole %, preferably 20 to 40 mole %
o=0–20 mole %, preferably 0 to 10 mole %
p=2–20 mole %, preferably 1 to 10 mole %
q=5–50 mole %, preferably 15 to 40 mole %

The variation in the proportion of these groups enables one of ordinary skill in the art to tailor the properties of the polymer to any specific needs in the resist process of resist element used in the practice of the present invention. The use of lower percentage portions of the required phenolic substituent (e.g., 5–40%, 10–30%, 15–30%) provides for a more flexible, less brittle polymer, while the use of higher percentages (e.g., 30–60%, 35–50%) provides for a polymer which is made more readily solubilized by the thermal energy. It is within the scope of the present invention to provide other linking groups within the polymer chain to tailor the polymer further.

Where the terminology "the polymer chain comprising" is used or no legally limiting language is used, that language allows for the presence of other groups within the polymer chain. Where the language "the polymer chain consisting essentially of" or "the polymer chain consisting of" is used, that language refers to limiting only the general types of repeating units on the polymer chain and does not apply to limiting the substitution on the polymer chain units themselves. As noted earlier, these polymers are described in the patent literature, and the inventors have provided a novel modified method described herein which appears to be advantageous for the control of the amount of phenolic substituent during the process of manufacturing the polymer.

As indicated by the above structural formula, the acetal polymers of this invention can be the required tetrameric acetal polymers or pentameric polymers. In the tetrameric polymer, the recurring unit comprises a vinyl acetate moiety and a vinyl alcohol moiety and first and second cyclic acetal groups as defined above. In the pentamers, the recurring unit comprises a vinyl alcohol moiety, a vinyl acetate moiety and first, second and third cyclic acetal group as described above. All three of the described available acetal groups are six-member cyclic acetal groups, one of them is substituted with an alkyl group, another with an aromatic group substituted with a hydroxy-, or a hydroxy- and alkoxy-, or hydroxy- and optionally nitro-, Br— group and acetylene —C≡C— groups; and a third is substituted with an acid group, an acid substituted alkyl group or an acid substituted aryl group.

The heat absorbing component of the composition of the present invention may be selected from amongst any of the known materials, which absorb infrared radiation and convert it to heat. These materials include, for example, organic and inorganic dyes and pigments, which absorb IR radiation and convert it to heat.

Carbon black, certain phthalocyanine pigments, squarine dyes, squarilium dyes, cyanine dyes, merocyanine dyes, pyrylium dyes, benzindolium dyes, metal oxides, metal sulfides and other classes of materials absorbing in the near infrared region known to those skilled in the art. The amount of the infrared absorbing, heat converting material present within the composition, is selected upon the basis of the amount of heat desired, the intensity of the IR source, the duration of the exposure (e.g., the length of the pulse from a laser), and other factors normally considered in addressing the sensitivity of the system. In general, the heat-absorbing component should be present in an amount of from 0.1 to 20% by weight of the composition, 0.5 to 10% by weight of the composition, 0.8 to 8% by weight of the composition, or 1 to 7% by weight of the composition. Higher amounts could be used, but these higher amounts would affect the physical properties of the resist layer. Lower amounts could be used, but laser systems, which are optimized for that, would have to be used.

The heat-sensitive compositions based on polymers of this invention provide lithographic printing plates characterized by improved abrasion resistance, extended press performance, and provide also an important advantage that they can be processed in aqueous alkaline developing solutions not containing organic solvents. It is conceivable that lithographic printing plates made from later optimized compositions according to the present invention will be able to run 500,000 prints.

The heat-sensitive compositions based on polymers of this invention, provide also high density printing circuit boards of high resolution, due to excellent film forming properties and improved adhesion resulting in low defect or no defect resist coatings at comparable low thickness and low cost, good solubility discrimination between irradiated and not exposed areas, good etch resistance to acidic and alkaline etchants, and good strippability in aqueous alkaline solutions.

There has also been provided, in accordance with another aspect of the present invention, the advantage of this composition to be applied from a liquid, or to be laminated as a dry monolayer film on the substrate for preparation of printing circuit board due to optimized thermal and mechanical characteristics of the invented composition.

To increase the sensitivity of the heat-sensitive composition of the present invention, a radiation absorbing agent capable of absorbing incident infrared radiation and converting it to heat is incorporated. The radiation absorbing materials suitable for the invented heat-sensitive compositions may be chosen from a wide range of organic and inorganic pigments such as carbon blacks, metal oxides, phthalocyanines, etc. Infrared absorbing dyes are also the preferable heat absorbing agents, which may be used in the compositions of the invention, especially those absorbing at wavelengths longer that 700 nm, such as between about 700 and 1300, with near infrared absorbing materials (between about 700 and 1000 nm) generally used.

The present invention also includes blends of polyvinyl acetal resins derived from aliphatic and aromatic aldehydes containing hydroxyl and/or other functional groups , described above, with other polymers such as acrylates, methacrylates, polyurethanes, styrene-maleic anhydride copolymers, phenolics, polyvinyl ketones, alkylvinylethers, cellulose derivatives, epoxy resins and others. These other resins may also provide additional physical properties that may be desirable for particular applications of the resist coatings of the present invention. For example, more oleophilic resins or polymers may be used to enhance the inking properties of a lithographic element. Thermally softenable polymers having better adhesion to particular surfaces may be added to the primary polyvinyl acetal resins used in the present invention to improve adhesion and especially improve dry film laminability, where a dry film laminating resist is used.

It is another aspect of the invention to provide a method for synthesis of the above mentioned polymers. The method provided in this invention allows facile achievement of high levels of acetalization of polyvinyl hydroxyl groups by an aromatic aldehyde containing a hydroxyl group with high conversion levels of aldehyde used.

It is another aspect of the invention, to provide a novel class of adhesion promoters to the resist compositions of the present invention for improved binding of the coated resist to at least copper surfaces due to the affinity of a triple bond (acetylene bond) within the adhesion promoter to copper.

The heat-sensitive compositions of the present invention suitable for application as a heat-sensitive positive working resist for producing printing circuit boards by heat mode imaging, and for application as a positive working printing form precursor also imaged by thermal laser, exhibit advantages generally described for positive thermal liquid resists. (Proceedings IPC Show 98, Ev. Halevy, Yossi Atiya). For example, the heat-sensitive compositions of the present invention need to undergo only thermally-induced composition change and are therefore free of photosensitive compounds which may alter their developability when irradiated with ultraviolet or visible radiation. Another advantage of the developed compositions is their capability to form films with good mechanical properties, and improved adhesion to substrates like anodized aluminum for printing plate preparation, and copper clad for producing printing circuit boards. The possibility to apply the composition from a liquid or by hot roller lamination as a dry film provides another advantage of the composition.

The advantage of use of water based developers not containing organic solvents and good solubility discrimination between the irradiated not exposed areas in these developers provides additional advantage of the heat-sensitive compositions described below. And at last, the insensitivity of the composition to white light allows handling of the coated products in white light.

The resist element of the invention may be generally described as a positive-acting thermal resist element comprising a metal substrate having adhered to at least one surface of the substrate a positive-acting thermal resist layer comprising:
 an acetal polymer comprising from 5–40% (mole basis) aliphatic acetal groups, and 10–60% (mole basis) phenolic acetal groups, and
 an infrared absorbing material in an amount of from 0.01 to 20 or 30% by weight of said positive-acting thermal resist layer. The resist layer is preferably from 1 to 30 micrometers in thickness, although if applied as a dry-film thermal resist layer, it may preferably be thicker, such as from 3 to 50 micrometers or 5–50 micrometers, or 10–50 micrometers. The solubility changes effected in the polymer compositions of the present invention are sufficiently persistent so that immediate development is not necessary. The latent image created by thermal imaging has been shown to persist for several days.

The polyvinyl acetal polymers of this invention comprise acetal polymers bearing the following recurring units within the polymer backbone:

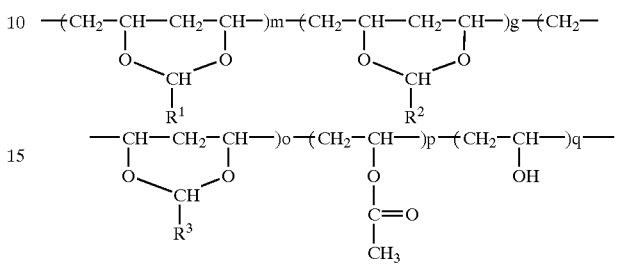

wherein:
 $R_1$ is $-C_nH_{2n+1}$ where n=1–12;
 $R_2$ is

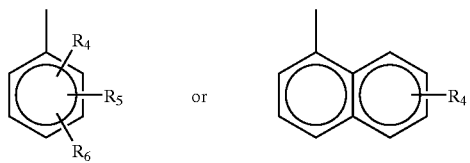

wherein
 $R_4 = -OH$; $R_5 = -OH$ or $-OCH_3$ or $-Br$ or $-O-CH_2-C\equiv CH$; and $R_6 = -Br$ or $-NO_2$;
 $R_3 = -(CH_2)_a-COOH$ or $-C\equiv CH$ or

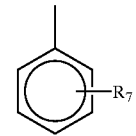

where
 $R_7 = COOH$, $-(CH_2)_aCOOH$ or $-O-(CH_2)_aCOOH$, and a=0 or 1,
and
 m=about 5–40 mole %, preferably 15 to 35 mole %
 g=about 10–60 mole %, preferably 20 to 40 mole %
 o=0–20 mole %, preferably 0 to 10 mole %
 p=1–20 mole %, preferably 1 to 10 mole %
 q=5–50 mole %, preferably 15 to 40 mole %

As indicated by the above structural formula, the acetal polymers of this invention can be tetramers, in which the recurring unit comprises a vinyl acetate moiety and a vinyl alcohol moiety and first and second cyclic acetal groups, or pentamers in which the recurring unit comprises a vinyl acetate moiety and first, second and third cyclic acetal group. All three of the acetal groups are six-member cyclic acetal groups, one of them is substituted with an alkyl group, another with an aromatic group substituted with a hydroxyl-, or a hydroxyl- and alkoxyl-, or hydroxyl-, and nitro- and bromine-groups; and a third is substituted with a carboxylic acid group, a carboxylic acid substituted alkyl group or a carboxylic acid substituted aryl group.

This structure for heat-sensitive polymers was chosen for at least the reasons that the mechanical properties of polymers based on a polyvinyl alcohol backbone are known as superior, the film forming characteristics are excellent, abrasion resistance is very good, also the resistance to chemical attack is excellent. The possibilities of modifying the polyvinyl alcohol are broad and easy performable.

The acetal units containing the phenolic groups tend to be primarily responsible for the imagability (heat-sensitivity) they may act like the novolak based polymers mentioned above. The hydroxyl groups can build up inter- and intramolecular hydrogen bonds with the acetal oxygens, or oxygens of the remaining hydroxyl groups from the backbone polymer molecules. These bonds will protect the polymer from easy dissolution in the alkaline developer. When the material is exposed to a source of incident energy, the radiation absorbing material converts the absorbed energy to heat that breaks the H-bonds built-up in the coated film, thereby promoting increased dissolution of the exposed areas. As a result of this bond breakage, discrimination in solubility of exposed and unexposed areas in aqueous alkaline developer occurs. The discrimination in solubility of the exposed and unexposed areas is an intrinsic property of the polymer films, and there is no need to introduce to the formulation dissolution inhibitors like diazonaphathoquinones (DNQ), or thermally generated species which might attack moieties or linkages within the polymer chain to increase their solubility. Such compounds may be present, but they add cost to materials and compounding of the resist layer and are not preferred additives. The solubility of the heated areas is substantially increased by an amount useful in a printing circuit board production, or lithographic printing plate process. The rate of discrimination may be just slightly increased due to formation of heat frangible complexes with any heat absorbing pigment or dye, used in the formulation in very low amount, the pigment or dye just being needed to convert the radiation energy to heat.

The pendant aliphatic acetal moiety is responsible for the thermal characteristics ($T_g$), hydrophobicity and ink acceptivity, when used for printing plates production, or etch resistance, when used in printing circuit boards fabrication.

The third acetal group, containing a carboxylic acid pendant to the acetal, or aromatic group bearing a carboxylic function, is believed to increase solubility in aqueous developer, and is optional in the polymer structure. So, by optimizing or tailoring proportions between the acetal moieties and remaining hydroxyl group of the backbone polymer, it is possible to achieve a polymer with desired characteristics for various specific uses and applications: sensitivity, thermal properties, (which are important in lamination of a dry resist film), mechanical properties, controlled solubility in aqueous alkaline developer, etch resistance and hydrophilicihydrophobic balance may each be manipulated by variation of the respective groups according to the above teachings describing their individual contributions to the properties of the polymer.

The polyvinyl acetal polymers that are used as the main or the only binder resin in heat-sensitive according to the present invention which undergo thermally-induced changes in their solubility in water/alkaline developers can be prepared by means of a novel synthesis and starting from inexpensive polymers available in large-scale technology. Starting substances for the preparation of the polymers according to the invention, are vinyl acetate-vinyl alcohol copolymers containing at least about 80% vinyl alcohol units and having mean molecular weights of about 2000 to 120000 or higher, preferably about 8000 to 50000 (the molecular weights being either number average or weight average molecular weights, the variations between them being relatively inconsequential for the overall practice of the present invention). Examples of suitable polyvinyl alcohols include those available in a range of molecular weights from Clariant GMbH under the trademarks MOWIOL 3-83, MOWIOL 3-98, MOWIOL 4-88 etc., other suitable polyvinyl alcohols available from AIR PRODUCTS CORP. under the trademark AIRVOL 103, 203, 502, etc., from ALDRICH and other suppliers.

Examples of suitable aldehydes useful in preparing the first cyclic acetal group of the acetal polymers of this invention include:

acetaldehyde
propionaldehyde
n-butyraldehyde
n-valeraldehyde
n-caproaldehyde
n-heptaldehyde
isobutyraldehyde
isovaleraldehyde, their mixtures and the like.

Examples of suitable aldehydes useful in preparing the second cyclic acetal group of the acetal polymers of this invention include:

2-hydroxybenzaldehyde
3-hydroxybenzaldehyde
4-hydroxybenzaldehyde
2-hydroxy-1-naphthaldehyde
2,4-dihydroxybenzaldehyde
3,5-dibromo-4-hydroxybezaldehyde
4-oxypropynyl-3-hydroxybenzaldehyde
vanillin
isovanilin
cinnamaldehyde
their mixtures, and the like.

Examples of suitable aldehydes useful in preparing the third cyclic acetal group of the acetal polymers of this invention include:

glyoxylic acid
2-formylphenoxyacetic acid
3-methoxy-4-formylphenoxy acetic acid
propargyl aldehyde, their mixtures and the like.

Acetalization of the polyvinyl alcohols takes place according to known standard methods; examples are described in U.S. Pat. No. 4,665,124; U.S. Pat. No. 4,940,646; U.S. Pat. No. 5,169,898; U.S. Pat. No. 5,700,619; U.S. Pat. No. 5,792,823; JP 09,328,519 etc.

This acetalization reaction generally requires addition of a strong inorganic or organic catalyst acid. Examples of catalyst acids are hydrochloric acid, sulfuric acid, phosphoric acid or p-toluenesulfonic acid. Other strong acids are also useful such as perfluoroalkylsulfonic acid, and other perfluoro-activated acids. The amount of acid should effectively allow protonation to occur, but will not significantly alter the final product by causing unwanted hydrolysis of the acetal groups. The reaction temperature of the acetalization depends on the kind of aldehyde as well as the desired level of substitution. It is between 0° C. and, if applicable, the boiling point of the used solvent. Organic solvents as well as mixtures of water with organic solvents are used. Particularly suitable organic solvents are alcohols (such as methanol, ethanol, propanol, butanol or glycol ether), cyclic ethers (such as 1,4-dioxane) or dipolar aprotic solvents (such as N,N-dimethylformamid, N-methyl pyrrolidone or dimethyl sulfoxide). If the acetalization is carried out in organic solvents or mixtures of organic solvents with water, the reaction product often remains in solution even if the starting polyvinyl alcohol was not completely dissolved. Not complete dissolution of the starting polyvinyl alcohol in organic solvents is a disadvantage that may lead to irreproducible degree of conversion and different products. Water or mixtures of organic solvents with water should be used to achieve complete dissolution of polyvinyl alcohol and reproducible products as a result of acetalization. The sequence of the addition of the various acetalization agents is often of no importance and comparable finished products are obtained from different preparation sequences. To isolate the finished products as a solid, the polymer solution is introduced into a non-solvent under vigorous stirring, filtered off and dried. Water is especially suitable as a non-solvent for the polymers.

The applicants have found that the unwanted hydrolysis of the acetal group achieved by acetalization with hydroxyl-substituted aromatic aldehydes takes place much easier than for the acetals built from aliphatic or not substituted aromatic aldehydes or from aldehydes containing carboxylic moieties at the same synthesis conditions. Presence of even small amount of water in the reaction mixture leads to decreased degree of acetalization and not complete conversion of the aromatic hydroxy aldehyde used. On the other hand it was found that in absence of water the hydroxy-substituted aromatic aldehydes react with hydroxyl groups of alcohols immediately and with almost 100% conversion. So, the process of acetalization of polyvinyl alcohols by hydroxy-substituted aromatic aldehydes to achieve the desired polyvinyl acetals according to the invention was carried out different from the known in the prior art. The main difference of the present invention is removing of water from the reaction mixture during the synthesis. The main amount of water may be removed by distillation under reduced pressure and replaced with an organic solvent. The applicants have found that the remaining in the reaction mixture water may be removed by addition to the mixture an organic material readily reacting with water and as a result of the reaction producing volatile materials or inert compounds. These materials may be chosen from carbonates, orthoesters of carbonic or carboxylic acids, easily reacting with water silica containing compounds, such as diethylcarbonate, trimethyl orthoformate, tetraethyl carbonate, tetraethyl silicate etc. The addition of these materials to reaction mixture lead to 100% conversion of the used aldehydes, and to the knowledge of the applicants was not used as a water removing agent in manufacturing of any type of polymeric acetals in prior art. (Use of triethyl orthoformate in synthesis of delta-lactones was mentioned in G. Saucy, R. Borer and D. P. Trullinger; J. Org. Chem., Vol. 42, No. 19, p.3206, 1977). A process according to this method for synthesis of polyvinyl acetal polymers, would comprise acetalization of a polyvinyl alcohol resin with a hydroxyl-substituted aromatic aldehyde(s) and strong catalyst acid, controlling the amount of hydrolysis of the acetal group achieved by acetalization with hydroxyl-substituted aromatic aldehydes by reducing the amount of water present with the polyvinyl alcohol and hydroxyl-substituted aromatic aldehyde(s) by removing water from the polyvinyl alcohol and hydroxyl-substituted aromatic aldehyde(s) by addition of materials that react with water and produce volatile and/or inert compounds with the water with sufficient speed that some of the water is effectively removed (reduced in concentration, not completely eliminated) before completion of the acetalization reaction. This process may, for example, use as the materials that react with water materials selected from the group consisting of organic carbonates, orthoesters of carbonic or carboxylic acids, and silicon containing compounds. Examples said silicon containing compounds are selected from the group consisting of silicates and silanes such as orthosilicates, metasilicates, and silanes containing ester group(s).

In this invention the preparation of the goal polymer may begin with dissolving of the starting polyvinyl alcohol in water at 80–90° C., then the solution is chilled to 60° C. and the acidic catalyst dissolved in an organic solvent is added, the solvents used in this invention are alcohols or glycol ethers, for example, n-propanol, 2-methoxyethanol or 1-methoxy 2-propanol (Dowanol PM, hereinafter referred to as "PM") and the like, then the solution of the aromatic hydroxyl-substituted aldehyde in the same solvent is added to the solution, immediately after addition of the aromatic aldehyde the solution of the aliphatic aldehyde and/or carboxylic substituted aldehyde, or other aldehyde in the same solvent is added and the reaction mixture is stirred at this temperature for additional 2 to 3 hours, then the azeotropic mixture of water with the organic solvent is removed by distillation and is replaced by the organic solvent. At this stage the conversion of the aromatic hydroxy aldehyde reaches 95–98%. Then the acid in the reaction mixture is neutralized and the mixture is blended with water to precipitate the polymer, the polymer is filtrated, washed with water and dried. The second way to achieve 100% of conversion of the aromatic hydroxyaldehyde to benzal is addition of water removing organic material (e.g. carbonate, orthoformate etc.) after addition of the aldehydes to the reaction mixture.

The radiation absorbing materials suitable for the invented heat-sensitive compositions were chosen from a wide range of organic and inorganic pigments such as carbon blacks, phtalocyanines or metal oxides. Green pigments: Heliogen Green D8730, D 9360, and Fanal Green D 8330 produced by BASF; Predisol 64H-CAB678 produced by Sun Chemicals, and black pigments: Predisol CAB2604, Predisol N1203, Predisol Black CB-C9558 produced by Sun Chemicals Corp. may serve examples for effective heat absorbing pigments. The amount of these pigments used in the composition is from 3 to 20% by weight of the composition, or preferred 3 to 7% by weight of the composition. Infrared absorbing dyes are the preferred heat absorbing agents, which may be used in the composition of the invention, especially those absorbing at wavelengths longer than 700 nm, such as between about 700 and 1100 nm. Examples of those may serve dyes produced by Epolin, Inc.: Epolight IV-62A, IV-62B and IV-66X; produced by American Dye Source Inc.: ADS 830, ADS 835 and ADS 840; produced by Hayashibara Biochemical Lab. Inc.: NK-2911 and NK-4432, etc. The amount of infrared absorbing dyes present in composition is usually lower then for pigment and should be present in an amount of from 0.1 to 5% by weight of the composition, or preferred 0.1 to 1% by weight of the composition.

The known affinity of acetylene triple bond containing compounds to copper (Jukes A. E., Advances in Organometallic Chemistry, v.12, N.Y., 1974, p. 215–322.) brought the applicants to use compounds of this class of materials as adhesion promoters for the heat-sensitive compositions to copper surface. As per knowledge of the applicants, no acetylenic compounds were used in such an application.

The adhesion promoters of this invention belong to esters, sulfoesters, amides, polyesters, polycarbonates and polyurethanes containing a triple bond or a sequence of triple bonds:

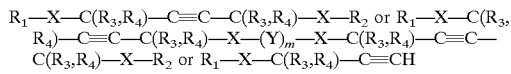

where:

$R_1$ and $R_2$=—$C_nH_{2n+1}$, substituted aromatic or heterocyclic fragment;

$R_3$ and $R_4$=H, or alkyl

X=—O—C(O)—, —O—S(O)—, —NH—C(O)—;

Y=—$C_nH_{2n}$ or substituted aromatic;

and can be achieved for example from propargyl alcohol or 2-butyn-1,4-diol, and appropriate chloroanhydride of a carboxylic or sulfonic acid, or aliphatic or aromatic isocyanate or diisocyanate; or from propargyl bromide or chloride or propargyl chloroformate and a suitable polyol or by any other way known to those skilled in the art. Polycarbonates containing triple bonds

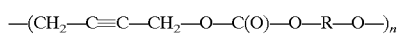

which may be obtained from 2-butyn-1,4-diol-dichloroformate and corresponding diols:

HO—R—OH, where: R=—$(CH_2)_n$—, n=2–6; R=—$CH_2CH_2$ $(OCH_2CH_2)_n$, n=1–4; R=—$CH_2$—CH=CH—$CH_2$—, —$CH_2$—C≡C—$CH_2$—,

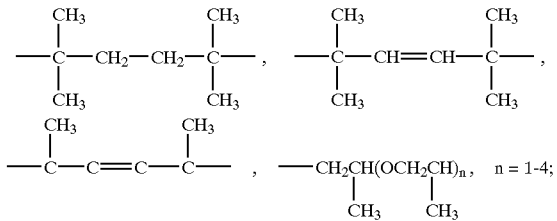

R=an aromatic group, e.g., =Ar—=—$C_6H_4$, —$C_{10}H_6$, etc.

As can be seen from these non-limiting examples, the acetylene bond may be present within the structure of the molecule or at a terminal position of the molecule.

In addition, colorants, plasticizers, surfactants, additional metal adhesion promoters, extenders, taggants, further resin components, etc. may be added to the heat-sensitive compositions. Useful colorants include dyes well known in the resist and printing plate coating formulation Methyl Violet, Ethyl Violet, Crystal Violet, basic Sudan Black, Victoria Blue R, Methylene Blue, Nigrosine and others. The dyes are preferably used in amounts from 0.01 to 2% by weight of the thermally-sensitive composition. Useful coating aids include fluorocarbon surfactants such as Zonyl's (DuPont) or FC-430 or FC-431 (Minnesota Mining and Manufacturing Co.) or other anionic, cationic, non-ionic, or mixed surfactants. The surfactant is preferably used in amounts of about 0.01 to 1% by total weight of the composition.

Examples of particularly useful plasticizers includes Tweens (e.g., from Imperial Chemicals Industries, ICI), polyoxyalkylene plasticizers (e.g., polyethyleneoxide/polypropyleneoxide cmonomers or copolymers), and the like. Plasticizers may be used within the widely known ranges, such as for example 0.1 to 15% by weight of the thermally sensitive polymer. Plasticizers are also known to assist the developability of the thermally sensitive polymers in the development step.

Fillers and extenders may also be used in the thermally imageable compositions of the present invention, for example in increasing the solids content of the compositions with additives that are inert or improve properties (such as thermal resistance or thermal transmission in the composition). Fillers can be used to build the thickness of the coated thermally imageable layer or adjust the strength and physical properties of the layer. They may be inert, particulate, or film-forming in their own right. Non-limiting examples of particularly suitable inert fillers include starch, kaolin, titanium dioxide, silica, polytetrafluoroethylene, and talc.

The thermally-sensitive compositions of this invention are useful for production of printing circuit boards, for lithographic printing plates and other heat-sensitive elements suitable for laser direct imaging. The heat sensitive (thermally imageable) compositions based on the compositions of the present invention are capable of additionally providing chemically milled metals of high precision. This is at least in part due to their excellent adhesion to a wide range of metals and alloys, the ability of that adhesion to be improved by the addition of additives without adversely affecting the performance of the compositions, good solubility discrimination between exposed an unexposed areas, good etch resistance (in particular to widely used ferric chloride etching solutions, and the ease with which residual composition may be stripped. This allows their use in the manufacture of small medical element parts such as stents and catheters by radiation exposure and wash-off development methods as known in the art, such as in U.S. Pat. No. 6,027,863.

The heat sensitive compositions based on compositions of the present invention may also provide thermally activated resists for use in the manufacture of printing plates, such as gravure cylinder masters.

Suitable substrates include regular copper foil, reverse treated copper foil, drum side treated copper foil and double treated copper foil clad on a plastic laminate used for production of printing circuit boards; aluminum plates and sheets and anodized aluminum plates and sheets used in printing plate production. Substrates such as steel, polymers (e.g., nylon, high density polyolefins, polycarbonates, polyacrylates, polyvinyl resins, and the like) may be used to form a screen printing stencil. Chrome and copper substrates may also be used in the formation of gravure printing plates.

The solvents that are used in this invention are glycol ethers, PM or 2-methoxyethanol. The solid content of the polymer material in the solution depends on the desired dry thickness of the film and is in the range from 5 to 25% by weight.

Another way of application is coating of a suitable intermediate substrate (polyester or polyethylene) with the solution of the thermally sensitive composition, drying, and then application of the film on the final substrate (copper) by hot-pressure lamination.

After adequate drying of the applied coating the printing plates were imaged by exposure by means of a laser beam in a CREO PLATESETTER-3244, and the printing circuit boards in a CREO DIAMOND 2028F imager. The exposed areas were developed using a solution of an alkali metal salt, or a mild alkali hydroxide solution.

The invention is further illustrated by the following examples of its practice.

PREPARATION EXAMPLE 1

110 grams of MOWIOL® 3-98 polyvinyl alcohol (an 98% hydrolyzed polyvinyl acetate having an average molecular weight of about 16000,), were added to a closed reaction vessel fitted with a water-cooled condenser, a dropping funnel and thermometer, containing 250 grams of demineralized water. With continual stirring, the mixture was heated for 1 hour at 90° C. till became a clear solution. After this the temperature was adjusted to 60° C. and 3 grams of concentrated sulfuric acid were added. Over 15 minutes period, a solution of 59.8 grams of 4-hydroxybenzaldehyde and 1.4 grams of 2,6-di-t-butyl-4-methylphenol in 450 grams of 2-methoxyethanol was added in a dropwise manner. The reaction mixture was diluted with additional 500 grams of 2-methoxyethanol, and 35.3 grams of n-butyraldehyde in 500 grams of 2-methoxyethanol were added in a dropwise manner, upon complete addition of the aldehydes, the reaction was continued at 50° C. for additional 3 hours. The water was distilled out from the reaction mixture and replaced with 2-methoxyethanol (less than 0.3% of water remains in the solution). The reaction mixture neutralized with sodium hydrogen carbonate to pH 7±0.5, then was blended with 15 liters of water:methanol (10:1). The precipitated polymer was washed with water filtered and dried in vacuum at 50° C.

178 grams of polymer were obtained, with a yield of 95.2% (calculated on the basis of the PVA), 92% conversion of 4-hydroxybenzladehyde. The structure of the polymer was in accordance with the structural formula in which the $R_1$ group is derived from n-butyraldehyde and the $R_2$ group is derived from 4-hydroxybenzaldehyde, the value of m is 36 mole %, the value of g is 37 mole %, the value of p is 2 mole %, and the value of q is 25 mole %. ($T_g$ 63° C.)

PREPARATION EXAMPLE 2

110 grams of MOWIOL® 3–83 polyvinyl alcohol (an 83% hydrolyzed polyvinyl acetate having a number average molecular weight of about 14000), were added to a closed reaction vessel fitted with a water-cooled condenser, a dropping funnel and thermometer, containing 110 grams of demineralized water and 110 grams of methanol. With continual stirring, the mixture was heated for 0.5 hour at 80° C. till became a clear solution. After this the temperature was adjusted to 60° C. and 3 grams of concentrated sulfuric acid in 100 grams of PM were added. Over 15 minutes period, a solution of 65 grams of 3-hydroxybenzaldehyde and 1.4 grams of 2,6-di-t-butyl-4-methylphenol in 450 grams of PM was added in a dropwise manner. The reaction mixture was diluted with additional 200 grams of PM, and 9.2 grams of n-butyraldehyde in 200 grams of PM were added in a dropwise manner, upon complete addition of the aldehydes, the reaction was continued at 50° C. for additional 3 hours. At this stage the conversion of the butyraldhyde is completed and the conversion of the 3-hydroxybenzaldehyde is close to 50%. 500 grams of trimethyl orthoformate were added to the reaction mixture in a dropwise manner under stirring. After addition of the trimethyl orthoformate the conversion of 3-hydroxybenzaldelhyde reached 100% (less then 0.1% of water in the reaction mixture).

158 grams of polymer were obtained, with a yield of 96.8% (calculated on the basis of the PVA). The structure of the polymer was in accordance with the structural formula in which the $R_1$ group is derived from n-butyraldehyde and the $R_2$ group is derived from 3-hydroxybenzaldehyde, the value of m is 12 mole %, the value of g is 49 mole %, the value of p is 17 mole %, and the value of q is 22 mole %. ($T_g$ 59° C.)

PREPARATION EXAMPLE 3

110 grams of AIRVOL® 103 polyvinyl alcohol (an 98% hydrolyzed polyvinyl acetate having a number average molecular weight of about 18000), were added to a closed reaction vessel fitted with a water-cooled condenser, a dropping funnel and thermometer, containing 250 grams of demineralized water. With continual stirring, the mixture was heated for 1 hour at 90° C. till became a clear solution. After this the temperature was adjusted to 60° C. and 3 grams of concentrated sulfuric acid in 100 grams of PM were added. Over 15 minutes period, a solution of 61 grams of 2-hydroxybenzaldehyde (salicylic aldehyde) and 1.4 grams of 2,6-di-t-butyl-4-methylphenol in 450 grams of PM was added in a dropwise manner. The reaction mixture was diluted with additional 500 grams of PM, and 27 grams of n-butyraldehyde and 10 grams of glyoxylic acid in 500 grams of PM were added in a dropwise manners upon complete addition of the aldehydes, the reaction was continued at 50° C. for additional 3 hours. The water was distilled out from the reaction mixture and replaced with PM (10 grams of water—less than 1.5%—remains in the solution). 100 grams of triethyl orthoformate were added to the reaction mixture under stirring. At this point less then 0.1% of water found in the reaction mixture, and the conversion of the salicylic aldehyde to benzal is quantitative. The reaction mixture neutralized with sodium hydrogen carbonate to pH 7±0.5, then blended with 15 liters of water:methanol (10:1). The precipitated polymer was washed with water filtered and dried in vacuum at 50° C.

185.8 grams of polymer were obtained, with a yield of 97.6% (calculated on the basis of the PVA), 100% conversion of 2-hydroxybenzaldehyde. The structure of the polymer was in accordance with the structural formula in which the $R_1$ group is derived from n-butyraldehyde the $R_2$ group is derived from 2-hydroxybenzaldehyde, and the $R_3$ group is derived from glyoxylic acid; value of m is 30 mole %, the value of g is 41 mole %, the value of p is 2 mole %, the value of o is 9 mole %, and the value of q is 20 mole %. ($T_g$ 68° C.)

PREPARATION EXAMPLE 4

110 grams of AIRVOL® 502 polyvinyl alcohol (an 88% hydrolyzed polyvinyl acetate having an average molecular weight of about 16000,), were added to a closed reaction vessel fitted with a water-cooled condenser, a dropping funnel and thermometer, containing 110 grams of demineralized water and 110 grams of methanol. With continual stirring, the mixture was heated for 1 hour at 90° C. till became a clear solution. After this the temperature was adjusted to 60° C. and 3 grams of concentrated sulfuric acid in 100 grams of PM were added. Over 15 minutes period, a solution of 61 grams of 3-hydroxybenzaldehyde and 1.4 grams of 2,6-di-t-butyl-4-methylphenol in 450 grams of PM was added in a dropwise manner. The reaction mixture was diluted with additional 200 grams of PM, and 18.2 grams of n-butyraldehyde and 8.1 grams of propargyl aldehyde in 500 grams of PM were added in a dropwise manner, upon complete addition of the aldehydes, the reaction was continued at 50° C. for additional 3 hours. The water was distilled out from the reaction mixture and replaced with PM. At this point less then 0.2% of water found in the reaction mixture, and the conversion of the m-hydroxybenzaldehyde to benzal is quantitative. The reaction mixture neutralized with sodium hydrogen carbonate to pH 7±0.5, then blended with 15 liters of water:methanol (10:1). The precipitated polymer was washed with water filtered and dried in vacuum at 50° C.

177 grams of polymer were obtained, with a yield of 97.6% (calculated on the basis of the PVA), 100% conversion of m-hydroxybenzaldehyde. The structure of the polymer was in accordance with the structural formula in which the $R_1$ group is derived from n-butyraldehyde the $R_2$ group is derived from 3-hydroxybenzaldehyde, and the $R_3$ group is derived from propargyl aldehyde; value of m is 21 mole %, the value of g is 43 mole %, the value of p is 2 mole %, the value of o is 10 mole %, and the value of q is 24 mole %. ($T_g$ 65° C.).

PREPARATION EXAMPLE 5

110 grams of AIRVOL® 103 polyvinyl alcohol (an 98% hydrolyzed polyvinyl acetate having an average molecular weight of about 18000,), were added to a closed reaction vessel fitted with a water-cooled condenser, a dropping funnel and thermometer, containing 250 grams of demineralized water. With continual stirring, the mixture was heated for 1 hour at 90° C. till became a clear solution. After this the temperature was adjusted to 60° C. and 3 grams of concentrated sulfuric acid in 100 grams of PM were added. Over 15 minutes period, a solution of 33 grams of 2-hydroxybenzaldehyde (salicylic aldehyde), 38 grams of 3-methoxy-4-hydroxybenzaldehyde (vanillin) and 1.4 grams of 2,6-di-t-butyl-4-methylphenol in 500 grams of PM was added in a dropwise manner. The reaction mixture was diluted with additional 200 grams of PM, and 35.3 grams of n-butyraldehyde in 500 grams of PM were added in a dropwise manner, upon complete addition of the aldehydes, the reaction was continued at 50° C. for additional 3 hours. The water was distilled out from the reaction mixture and replaced with PM (15 grams of water—less than 2%—remains in the solution). 80 grams of trimethyl orthoformate were added to the reaction mixture under stirring. At this point less then 0.1% of water found in the reaction mixture, and the conversion of the salicylic aldehyde and vanillin to corresponding benzals is quantitative. The reaction mixture neutralized with sodium hydrogen carbonate to pH 7±0.5, then blended with 15 liters of water:methanol (10:1). The precipitated polymer was washed with water filtered and dried in vacuum at 50° C.

186 grams of polymer were obtained, with a yield of 94% (calculated on the basis of the PVA), 100% conversion of salicylic aldehyde and vanillin. The structure of the polymer was in accordance with the structural formula in which the $R_1$ group is derived from n-butyraldehyde the $R_2$ group is derived from a 1:1 mixture of 2-hydroxybenzaldehyde and vanillin; value of m is 38 mole %, the value of g is 42 mole %, the value of p is 2 mole %, and the value of q is 18 mole %. ($T_g$ 71° C.).

PREPARATION EXAMPLE 6

110 grams of Airvol 203 polyvinyl alcohol (an 88% hydrolyzed polyvinyl acetate having an average molecular weight of about 18000,), were added to a closed reaction vessel fitted with a water-cooled condenser, a dropping funnel and thermometer, containing 110 grams of demineralized water and 110 grams of methanol. With continual stirring, the mixture was heated for 1 hour at 80° C. till became a clear solution. After this the temperature was adjusted to 60° C. and 3 grams of concentrated sulfuric acid in 100 grams of PM were added. Over 15 minutes period, a solution of 32 grams of 4-hydroxybenzaldehyde, 30 grams of 2-hydroxy-1-naphthaldehyde and 1.4 grams of 2,6-di-t-butyl-4-methylphenol in 500 grams of PM was added in a dropwise manner. The reaction mixture was diluted with additional 200 grams of PM, and 21.4 grams of n-butyralclehyde in 500 grams of PM were added in a dropwise manner, upon complete addition of the aldehydes, the reaction was continued at 50° C. for additional 3 hours. The water was distilled out from the reaction mixture and replaced with PM. At this point less then 0.21% of water found in the reaction mixture, and the conversion of the aromatic aldehydes to benzal is quantitative. The reaction mixture neutralized with sodium hydrogen carbonate to pH 7±0.5, then blended with 15 liters of water:methanol (10:1). The precipitated polymer was washed with water filtered and dried in vacuum at 50° C.

170 grams of polymer were obtained, with a yield of 96% (calculated on the basis of the PVA), 100% conversion of 4-hydroxybenzaldehyde and 2-hydroxy-1-naphthaldehyde. The structure of the polymer was in accordance with the structural formula in which the $R_1$ group is derived from n-butyraldehyde the $R_2$ group is derived from a mixture of 4-hydroxybenzaldehyde and 2-hydroxy-1-naplhthaldehyde; value of m is 25 mole %, the value of g is 38 mole %, the value of p is 12 mole %, and the value of q is 26 mole %. ($T_g$ 74° C.).

PREPARATION EXAMPLE 7

120 grams of AIRVOL® 502 polyvinyl alcohol (an 88% hydrolyzed polyvinyl acetate having an average molecular weight of about 16000,), were added to a closed reaction vessel fitted with a water-cooled condenser, a dropping funnel and thermometer, containing 120 grams of demineralized water and 100 grams of methanol. With continual stirring, the mixture was heated for 1 hour at 90° C. till became a clear solution. After this the temperature was adjusted to 60° C. and 12.4 grams of concentrated hydrochloric acid in 100 grams of PM were added. Over 30 minutes period, a solution of 40.3 grams of 4-formylphenoxyacetic acid and 30.8 grams of 2-hydroxybenzaldehyde and 1.5 grams of 2,6-di-t-butyl-4-methylphenol in 750 grams of PM was added in a dropwise manner. The reaction mixture was diluted with additional 200 grams of PM, and 34.2 grams of isovaleraldehyde in 500 grams of PM were added in a dropwise manner, upon complete addition of the aldehydes, the reaction was continued at 50° C. for additional 3 hours. The water was distilled out from the reaction mixture and replaced with PM. At this point less then 0.1% of water found in the reaction mixture, and the conversion of the 2-hydroxybenzaldehyde and the 4-formylphenoxyacetic acid to benzals is quantitative. The reaction mixture neutralized with ammonium carbonate to pH 7±0.5, then blended with 15 liters of water:methanol (10:1). The precipitated polymer was washed with water filtered and dried in vacuum at 50° C.

194 grams of polymer were obtained, with a yield of 92.6% (calculated on the basis of the PVA). The structure of the polymer was in accordance with the structural formula in which the $R_1$ group is derived from isovaleraldehyde the $R_2$ group is derived from 2-hydroxybenzaldehyde, and the $R_3$ group is derived from 4-formylphenoxyacetic acid; value of m is 16 mole %, the value of g is 10 mole %, the value of p is 12 mole %, the value of o is 18 mole %, and the value of q is 44 mole %. ($T_g$ 65° C.).

PREPARATION EXAMPLE 8

110 grams of Mowiol 3-98 polyvinyl alcohol (an 98% hydrolyzed polyvinyl acetate having an average molecular weight of about 16000,), were added to a closed reaction vessel fitted with a water-cooled condenser, a dropping funnel and thermometer, containing 250 grams of demineralized water. With continual stirring, the mixture was heated for 1 hour at 90° C. till became a clear solution. After this the temperature was adjusted to 60° C. and 6 grams of p-toluenesulfonic acid were added. Over 15 minutes period, a solution of 152 grams of 3,5-dibromo-4-hydroxybenzaldehyde and 1.4 grams of 2,6-di-t-butyl-4-methylphenol in 750 grams of PM was added in a dropwise manner. The reaction mixture was diluted with additional 500 grams of PM, and 12.3 grams of n-butyraldehyde in 500 grams of PM were added in a dropwise manner, upon complete addition of the aldehydes, the reaction was continued at 50° C. for additional 3 hours. The water was distilled out from the reaction mixture and replaced with PM (less than 1% of water remains in the solution). 100 grams of triethyl orthoformate were added to the reaction mixture. Less then 0.1% of water detected in the reaction mixture, the conversion of the 3,5-dibromo-4-hydroxyaldehyde is quantitative. The reaction mixture neutralized with ammonium carbonate to pH 7±0.5, then was blended with 15 liters of water:methanol (10:1). The precipitated polymer was washed with water filtered and dried in vacuum at 50° C.

248 grams of polymer were obtained, with a yield of 95.2% (calculated on the basis of the PVA). The structure of the polymer was in accordance with the structural formula in which the $R_1$ group is derived from n-butyraldehyde and the $R_2$ group is derived from 3,5-dibromo-4-hydroxybenzaldehyde, the value of m is 14 mole %, the value of g is 44 mole %, the value of p is 2 mole %, and the value of q is 40 mole %. ($T_g$ 73° C.)

APPLICATION EXAMPLE 1

The polymer from Preparation example 1 was dissolved in PM and was utilized in preparing a heat-sensitive composition of the following formulation:

| Component | Weight % |
|---|---|
| Acetal Polymer1 | 13.2 |
| Pigment (Predisol N1203*) | 0.8 |
| Surfactant | 0.05 |
| Dowanol PM | 85.95 |

*Sun Chemicals

The composition was ball-milled for 12 hours, filtered and coated on the surface of a pre-cleaned and microetched regular copper clad of 0.5 oz., on 8 mil glass-epoxy laminate. After drying for 3 minutes at 130° C. the resulting plate has a coating of 5.5 grams/m² dry thickness. The plate was imaged in the Creo Diamond 2028F imager. The energy density required to give a very good image was 200 mJ/cm². The plate was developed in 5% sodium methasilicate solution in water for 60 seconds, providing an image with 2 mil line to space ratio. The developed plate was etched in a conventional copper chloride etcher, resulting in a printing circuit with sharp edges of the conductors and 2 mil line to space ratio.

APPLICATION EXAMPLE 2

The polymer from Preparation example 2 was dissolved in Dowanol PM and was utilized in preparing a heat-sensitive composition of the following formulation:

| Component | Weight % |
|---|---|
| Acetal Polymer 2 | 16.0 |
| Adhesion promoter-1,3,5-tris[propargyloxycarbonyl]benzene | 0.05 |
| Pigment Heliogen Green D 8330* | 1 |
| Surfactant | 0.05 |
| Dowanol PM | 82.9 |

*BASF

The composition was ball-milled for 12 hours, filtered and coated on the surface of a pre-cleaned reverse treated copper clad of 1 oz., on 20 mil glass-epoxy laminate. After drying for 4 minutes at 130° C. the resulting plate has a coating of 9.5 grams/m² dry thickness. The plate was imaged in the Creo Diamond 2028F imager. The energy density required to give a very good image was 300 mJ/cm². The plate was developed in 0.75% sodium hydroxide solution in water for 50 seconds, providing an image with 2 mil line to space ratio. The developed plate was etched in a conventional copper chloride etcher, resulting in a printing circuit with sharp edges of the conductors and 2 mil line to space ratio.

APPLICATION EXAMPLE 3

The polymer from Preparation example 3 was dissolved in DowanolJ PM and was utilized in preparing a heat-sensitive composition of the following formulation:

| Component | Weight % |
|---|---|
| Acetal Polymer 3 | 15.0 |
| Adhesion promoter-2,4,6-tris(2-propynyloxy)-1,3,5-triazine | 0.03 |
| IR dye-NK-2911* | 0.08 |
| Colorant-Methylene Blue | 0.05 |
| Surfactant | 0.05 |
| Dowanol PM | 84.57 |

*Hayashibara Biochemical Lab. Inc.

The components of the composition were dissolved in PM, filtered and coated on the surface of a precleaned and microetched copper clad of 0.25 oz., on 8 mil glass-epoxy laminate. After drying for 3 minutes at 130° C. the resulting plate has a coating of 6.5 grams/m² dry thickness. The plate was imaged in the Creo Diamond 2028F imager. The energy density required to give a very good image was 250 mJ/cm². The plate was developed in 0.9 sodium hydroxide solution in water for 60 seconds, providing an image with 0.75 mil line to space ratio. The developed plate was etched in a conventional alkaline etcher, resulting in a printing circuit with sharp edges of the conductors and 0.75 mil line to space ratio.

APPLICATION EXAMPLE 4

The polymer from Preparation example 4 was dissolved in PM and was utilized in preparing a heat-sensitive composition of the following formulation:

| Component | Weight % |
|---|---|
| Acetal Polymer 4 | 16.0 |
| IR dye-NK-4432* | 0.1 |

-continued

| Component | Weight % |
|---|---|
| Surfactant | 0.05 |
| Colorant-Crystal Violet | 0.05 |
| Dowanol PM | 83.8 |

*Hayashibara Biochemical Lab. Inc.

The components of the composition were dissolved in PM, filtered and coated on the surface of a not precleaned copper clad of 0.5 oz., on 12 mil glass-epoxy laminate. After drying for 3 minutes at 130° C. the resulting plate has a coating of 6 grams/m² dry thickness. The plate was imaged in the Creo Diamond 2028F imager. The energy density required to give a very good image was 250 mJ/cm². The plate was developed in 0.7 sodium hydroxide solution in water for 60 seconds, providing an image with 1 mil line to space ratio. The developed plate was etched in a conventional alkaline etcher, resulting in a printing circuit with sharp edges of the conductors and 1 mil line to space ratio.

APPLICATION EXAMPLE 5

The polymer from Preparation example 4 was dissolved in DowanolJ PM and was utilized in preparing a heat-sensitive composition of the following formulation:

| Component | Weight % |
|---|---|
| Acetal Polymer 4 | 15.0 |
| Polyvinylacetate-co-crotonic acid** | 3 |
| IR dye-NK-2911* | 0.08 |
| Colorant Crystal Violet | 0.05 |
| Surfactant | 0.05 |
| Dowanol PM | 81.82 |

**Aldrich
*Hayashibara Biochemical Lab. Inc.

The components of the composition were dissolved in PM, filtered and coated on the surface of a not precleaned drum side treated copper clad of 0.5 oz., on 12 mil glass-epoxy laminate. After drying for 4 minutes at 130° C. the resulting plate has a coating of 9.5 grams/m² dry thickness. The plate was imaged in the Creo Diamond 2028F imager. The energy density required to give a very good image was 300 mJ/cm². The plate was developed in 0.75 sodium hydroxide solution in water for 60 seconds, providing an image with 1 mil line to space ratio. The developed plate was etched in a conventional acidic copper chloride etcher, resulting in a printing circuit with sharp edges of the conductors and 1 mil line to space ratio.

APPLICATION EXAMPLE 6

The same composition and preparation as in application example 5, but the polyvinyl-co-crotonic acid copolymer replaced by polymethylmethacrylate-co-methacrylic acid copolymer (Aldrich). After drying for 4 minutes at 130° C. the resulting plate has a coating of 9.5 grams/m² dry thickness. The plate was imaged in the Creo Diamond 2028F imager. The energy density required to give a very good image was 250 mJ/cm². The plate was developed in 0.8 sodium hydroxide solution in water for 60 seconds, providing an image with 1 mil line to space ratio. The developed plate was etched in a conventional alkaline etcher, resulting in a printing circuit with sharp edges of the conductors and 1 mil line to space ratio.

APPLICATION EXAMPLE 7

The polymer from Preparation example 4 was dissolved in DowanolJ PM and was utilized in preparing a heat-sensitive composition of the following formulation:

| Component | Weight % |
|---|---|
| Acetal Polymer 4 | 20.0 |
| IR dye-ADS-830* | 0.1 |
| Colorant-Crystal Violet | 0.2 |
| Surfactant | 0.05 |
| Dowanol PM | 79.65 |

*American Dye Source Inc.

The solution was coated on a 1 mil thick corona treated polyester liner and dried for 5 min at 120° C. The coated dry thickness of the achieved resist film is 12 micron. The film was hot laminated on a not pre-cleaned 0.5 oz drum-side treated surface copper clad on 8 mil glass-epoxy laminate (roller heated to 100° C.). The polyester cover stripped and the plate was imaged in the Creo Diamond 2028F imager. The energy density required to give a very good image was 300 mJ/cm². The plate was developed in 0.9 sodium hydroxide solution in water for 60 seconds, providing an image with 1 mil line to space ratio. The developed plate was etched in a conventional acidic copper chloride etcher, resulting in a printing circuit with sharp edges of the conductors and 1 mil line to space ratio, no signs of adhesion failure were found.

APPLICATION SAMPLE 8

The polymer from Preparation example 5 was dissolved in PM and was utilized in preparing a heat-sensitive composition of the following formulation:

| Component | Weight % |
|---|---|
| Acetal Polymer 5 | 15.0 |
| Adhesion promoter-polyurethane* | 0.35 |
| IR dye-NK-2911** | 0.08 |
| Colorant-Methylene Blue | 0.05 |
| Surfactant | 0.05 |
| Dowanol PM | 84.57 |

**Hayashibara Biochemical Lab. Inc.
*Polyurethane derived from 43 grams of 2-butyn-1,4-diol and 58 grams of oligomeric diphenylmethanediisocyanate(Bayer) in presence of 0.12 grams of dibutyltin dilaurate in a THF solution.

The components of the composition were dissolved in PM, filtered and coated on the surface of a non-precleaned double treated copper clad of 0.5 oz., on 8 mil glass-epoxy laminate. After drying for 4 minutes at 130° C. the resulting plate has a coating of 8 grams/m² dry thickness. The plate was imaged in the Creo Diamond 2028F imager. The energy density required to give a very good image was 250 mJ/cm². The plate was developed in 5% sodium methasilicate solution in water for 60 seconds, providing an image with 1 mil line to space ratio. The developed plate was etched in a conventional alkaline etcher, resulting in a printing circuit with sharp edges of the conductors and 1 mil line to space ratio.

APPLICATION SAMPLE 9

The polymer from Preparation example 7 was dissolved in PM and was utilized in preparing a heat-sensitive composition of the following formulation:

| Component | Weight % |
|---|---|
| Acetal Polymer 7 | 18.0 |
| Adhesion promoter-2,4,6-tris(2-propynyloxy)-1,3,5-triazine | 0.02 |
| IR dye-ADS-830* | 0.08 |
| Colorant-Methylene Blue | 0.05 |
| Surfactant | 0.05 |
| Dowanol PM | 81.8 |

*American Dye Sources. Inc.

The components of the composition were dissolved in PM, filtered and coated on the surface of a pumice scrubbed copper clad of 0.5 oz., on 20 mil glass-epoxy laminate. After drying for 3 minutes at 130° C. the resulting plate has a coating of 5 grams/m$^2$ dry thickness. The plate was imaged in the Creo Diamond 2028F imager. The energy density required to give a very good image was 200 mJ/cm$^2$. The plate was developed in 2% sodium methasilicate solution in water for 40 seconds, providing an image with 1 mil line to space ratio. The developed plate was etched in a conventional alkaline etcher, resulting in a printing circuit with sharp edges of the conductors and 1 mil line to space ratio.

APPLICATION SAMPLE 10

The polymer from Preparation example 8 was dissolved in PM and was utilized in preparing a heat-sensitive composition of the following formulation:

| Component | Weight % |
|---|---|
| Acetal Polymer 8 | 12.8 |
| Adhesion promoter-2,4,6-tris(2-propynyloxy)-1,3,5-triazine | 0.03 |
| IR dye-ADS-830* | 0.05 |
| Colorant-Crystal Violet | 0.05 |
| Surfactant | 0.05 |
| Dowanol PM | 87402 |

*American Dye Sources. Inc.

The components of the composition were dissolved in PM, filtered and coated on the surface of a pre-cleaned drum-side treated copper clad of 0.5 oz., on 12 mil glass-epoxy laminate. After drying for 3 minutes at 130° C. the resulting plate has a coating of 9.5 grams/m$^2$ dry thickness. The plate was imaged in the Creo Diamond 2028F imager. The energy density required to give a very good image was 300 mJ/cm$^2$. The plate was developed in 2% sodium carbonate solution in water for 60 seconds at 35° C. with rinsing in hot (45° C.) water, providing an image with 1 mil line to space ratio. The developed plate was etched in a conventional acidic copper chloride etcher, resulting in a printing circuit with sharp edges of the conductors and 1 mil line to space ratio.

APPLICATION EXAMPLE 11

The polymer from Preparation example 6 was dissolved in Dowanol PM and was utilized in preparing a heat-sensitive composition of the following formulation:

| Component | Weight % |
|---|---|
| Acetal Polymer 6 | 12.0 |
| IR dye-ADS-830* | 0.12 |
| Colorant-Crystal Violet | 0.05 |
| Surfactant | 0.03 |
| Dowanol PM | 87.8 |

*American Dye Sources Ink.

The components of the composition were dissolved in PM, filtered and coated on the surface of anodized aluminum. After drying for 3 minutes at 120° C. the resulting plate has a coating of 2.5 grams/m$^2$ dry thickness. The plate was imaged in the Creo Platesetter 3244. The energy density required to give a very good image was 250 mJ/cm$^2$. The plate was developed in 5.5% sodium methasilicate solution in water for 80 seconds, rinsed off with water and dried. Using a sheet-fed press and a commercially available process black ink the printing plate was run for 100000 impressions without any image wear observed. The 0.5% highlight dots were acceptable at 150 lines/inch screen.

The invention has been described in detail, with particular reference to certain preferred embodiments, thereof, but it should be understood that variations and modifications can be effected within the spirit of and scope of the invention.

What is claimed is:

1. A positive-acting resist element comprising a substrate having at least one metal surface having adhered to at least one surface of the substrate a positive-acting resist layer comprising an acetal polymer comprising the general formula:

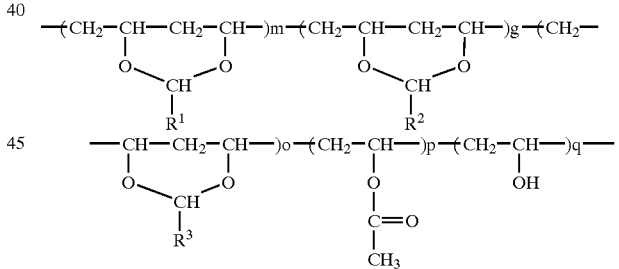

wherein $R_1$ is —$C_nH_{2n+1}$ where n=1–12;

$R_2$ is

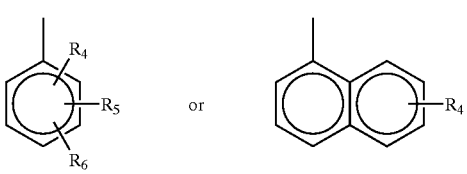

wherein
R_4=—OH; R_5=—OH or —OCH_3 or —Br or —O—CH_2—C≡CH; and R_6=—Br or —NO_2;
R_3=—(CH_2)_a—COOH or —C≡CH or

where
R_7=COOH, —(CH_2)_aCOOH or —O—(CH_2)_aCOOH, and a=0 or 1;
and
m=5–40 mole %,
g=10–60 mole %,
o=0–20 mole %,
p=1–10 mole %, and
q=5–50 mole %,; and
an infrared absorbing material in an amount of from 0.01 to 20% by weight of said positive-acting thermal resist layer.

2. The positive-acting resist element of claim 1 wherein the positive-acting resist layer is a positive-acting thermal resist layer comprising:
an acetal polymer comprising from 5–40% (mole basis) aliphatic acetal groups, 10–60% (mole basis) substituted phenolic acetal groups, 5–50% (mole basis) vinylalcohol groups and 1–10% (mole basis) vinylacetate groups and
an infrared absorbing material in an amount of from 0.01 to 20% by weight of said positive-acting thermal resist layer.

3. The positive-acting resist element of claim 1 wherein said metal is selected from the group consisting of chrome, aluminum and cooper.

4. The positive-acting resist element of claim 1 wherein said metal is selected from the group consisting of aluminum and copper and said positive-acting resist layer contains an adhesion-promoting amount of a compound having an acetylene bond therein.

5. The positive-acting resist element of claim 1 wherein at least one pendant group in said acetal polymer has an acetylene-bond containing group therein.

6. The positive-acting resist element of claim 1 wherein said infrared absorbing material comprises an infrared-absorbing pigment.

7. The positive-acting resist element of claim 1 wherein said infrared absorbing material comprises an infrared-absorbing dye.

8. The positive-acting resist element of claim 1 wherein the resist layer is free of photosensitive compounds which alter their developability when irradiated with ultraviolet or visible radiation.

9. The positive-acting resist element of claim 1 wherein the resist layer has an average thickness if between 1 and 30 micrometers.

10. A direct process for producing an imaged pattern on a printing plate surface comprising the steps of forming the positive-acting resist element of claim 1:
a) directing to selected areas of said element a focused beam of energy in a fluence of sufficient intensity to effect a thermally-induced transformation in the solubility properties of said positive-acting resist layer; and
b) contacting aid element with a developer effective to remove said layer from areas struck by said beam of energy.

11. The process of claim 10 wherein said metal comprises copper or aluminum.

12. The process of claim 10 wherein said positive-acting resist layer further comprises an adhesion-promoting amount of a compound containing acetylene bonds.

13. The positive-acting resist element of claim 2 wherein said metal is selected from the group consisting of chrome, aluminum and copper.

14. The positive-acting resist element of claim 2 wherein said metal is selected from the group consisting of aluminum and copper and the resist layer contains an adhesion-promoting amount of a compound having an acetylene bond therein.

15. The positive-acting resist element of claim 2 wherein at least one pendant group on said acetal polymer has an acetylene-bond containing group therein.

16. The positive-acting resist element of claim 2 wherein said infrared absorbing material comprises an infrared-absorbing pigment.

17. The positive-acting resist element of claim 2 wherein said infrared absorbing material comprises an infrared-absorbing dye.

18. The positive-acting resist element of claim 2 wherein the resist layer is free of photosensitive compounds which alter their developability when irradiated with ultraviolet or visible radiation.

19. The positive-acting resist element of claim 2 wherein the resist layer has an average thickness of between 1 and 30 micrometers.

* * * * *